(12) United States Patent
Park et al.

(10) Patent No.: US 12,721,124 B2
(45) Date of Patent: Aug. 25, 2026

(54) VIA ALIGNMENT IN SINGLE DAMASCENE STRUCTURE

(71) Applicant: INTERNATIONAL BUSINESS MACHINES CORPORATION, Armonk, NY (US)

(72) Inventors: Chanro Park, Clifton Park, NY (US); Koichi Motoyama, Clifton Park, NY (US); Hsueh-Chung Chen, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 726 days.

(21) Appl. No.: 17/551,998

(22) Filed: Dec. 15, 2021

(65) Prior Publication Data

US 2023/0187278 A1 Jun. 15, 2023

(51) Int. Cl.
*H10W 20/00* (2026.01)
*H10W 20/42* (2026.01)

(52) U.S. Cl.
CPC ......... *H10W 20/069* (2026.01); *H10W 20/42* (2026.01)

(58) Field of Classification Search
CPC ........... H10W 20/069; H10W 20/0693; H10W 20/077; H10W 20/084; H10W 20/42; H10W 20/425
See application file for complete search history.

(56) References Cited

U.S. PATENT DOCUMENTS

| | | | | |
|---|---|---|---|---|
| 6,638,851 | B2 | 10/2003 | Cowley et al. | |
| 7,214,609 | B2 | 5/2007 | Jiang et al. | |
| 9,224,686 | B1 | 12/2015 | Chen et al. | |
| 10,354,912 | B2 | 7/2019 | Xu et al. | |
| 10,395,986 | B1 * | 8/2019 | Briggs | H01L 21/76808 |
| 2013/0299990 | A1 | 11/2013 | Chen | |
| 2019/0363048 | A1 * | 11/2019 | Zhao | H01L 23/5226 |
| 2020/0075456 | A1 * | 3/2020 | Chanemougame | H10W 20/084 |
| 2020/0203212 | A1 | 6/2020 | Reshotko et al. | |
| 2020/0279769 | A1 * | 9/2020 | Park | H01L 21/76834 |
| 2020/0286780 | A1 * | 9/2020 | Li | H01L 21/76883 |

OTHER PUBLICATIONS

Shauly, Eitan N., "Physical, electrical, and reliability considerations for copper BEOL layout design rules," Journal of Low Power Electronics and Applications, Jun. 2018, 33 pages, 8, 2.

(Continued)

*Primary Examiner* — Fazli Erdem
(74) *Attorney, Agent, or Firm* — Harrity & Harrity, LLP

(57) ABSTRACT

An interconnect structure that in one embodiment can include a first metal line level having a first metal line, a second metal line level having a second metal line, and a via line level present between the first and second metal line levels. The via line level includes a via interlevel dielectric surrounding a via stack. The via stack may include an interface metal portion that is in contact with the first metal line, a via intralevel dielectric on the interface metal portion, and a cap metal portion in contact with the second metal line and extending through the via intralevel dielectric into contact with the interface metal portion. In some embodiments, the length of the interface metal portion of the via is greater than a width of the interface metal portion of the via stack.

20 Claims, 3 Drawing Sheets

(56) References Cited

OTHER PUBLICATIONS

Lapedus, Mark, “Breaking the 2nm Barrier,” https://semiengineering.com/breaking-the-2nm-barrier/, Feb. 2021, 22 pages.
Lapedus, Mark, “What Will Replace Duel Damascene?” https://semiengineering.com/what-will-replace-dual-damascene/, Jan. 2013, 9 pages.
Beyer, Gerald, et al., “BEOL technology at 20nm half-pitch,” Solid State Technology, May 2011, pp. 16-18, 54, 5.

* cited by examiner

L1
10
5
A'
50
B'
B
L3
A
L2

Mx+1
Rx
Mx
5
7
50
W3
10
W2
6
16
15
55
16
W1
56
13
60
13
14

51
7
6
6
50
L3
16
56
55
15
13
60
13
10
14

VIA ALIGNMENT IN SINGLE DAMASCENE STRUCTURE

BACKGROUND

The present disclosure relates to interconnects for transmitting electrical signal, and more particularly to metal vias in single damascene process flows.

Interconnects are the wiring schemes in integrated circuits, which may be formed during back-end-of-line (BEOL) processing. Interconnects can distribute clock and other signals, provide power and ground for various electronic system components, and connect the transistors within the integrated circuit (IC) chip front-end-of-line (FEOL). Interconnects are organized in different metal layers, local ($M_x$), intermediate, semi-global and global wires. Each of these layers contains (unidirectional) metal lines (or tracks) and dielectric materials. They are interconnected vertically by means of via structures that are filled with metal.

SUMMARY

In one aspect of the present disclosure, a semiconductor structure is described that in one embodiment includes a first dielectric positioned on a first metal contact. A second dielectric is laterally surrounding the first dielectric and the first metal contact. A second metal contact is present extending through the first dielectric into contact with the first metal contact.

In another embodiment, an interconnect structure is described that in one embodiment can include a first metal line level having a first metal line, a second metal line level having a second metal line, and a via line level present between the first and second metal line levels. The via line level includes a via interlevel dielectric surrounding a via stack. The via stack may include an interface metal portion that is in contact with the first metal line, a via intralevel dielectric on the interface metal portion, and a cap metal portion in contact with the second metal line and extending through the via intralevel dielectric into contact with the interface metal portion. In some embodiments, the length of the interface metal portion of the via is greater than a width of the interface metal portion of the via stack.

In another aspect of the present disclosure, a method of forming a semiconductor device is provided that in one embodiment includes forming a via interface metal portion of a via stack through an interlevel dielectric layer of a via level to a first metal line in a first metal line level. The via interface metal portion has an upper surface vertically offset from the interlevel dielectric layer. An intralevel dielectric layer is formed on a recessed surface of the interface metal portion of the via stack, and a line interlevel dielectric layer of a second metal line level is formed atop the via level. The line interlevel dielectric layer having a trench overlying at least the recessed surface of the interface metal portion of the via stack. An electrically conductive fill is deposited in the trench of the line interlevel dielectric layer to provide a second metal line. A portion of the electrically conductive fill is positioned on the recessed surface of the interface metal portion to provide a cap metal portion of the via stack that is in electrical communication with the second metal line and is aligned with the interface metal portion of the via stack.

DETAILED DESCRIPTION OF PREFERRED EMBODIMENTS

Figures 1, 2, 3:
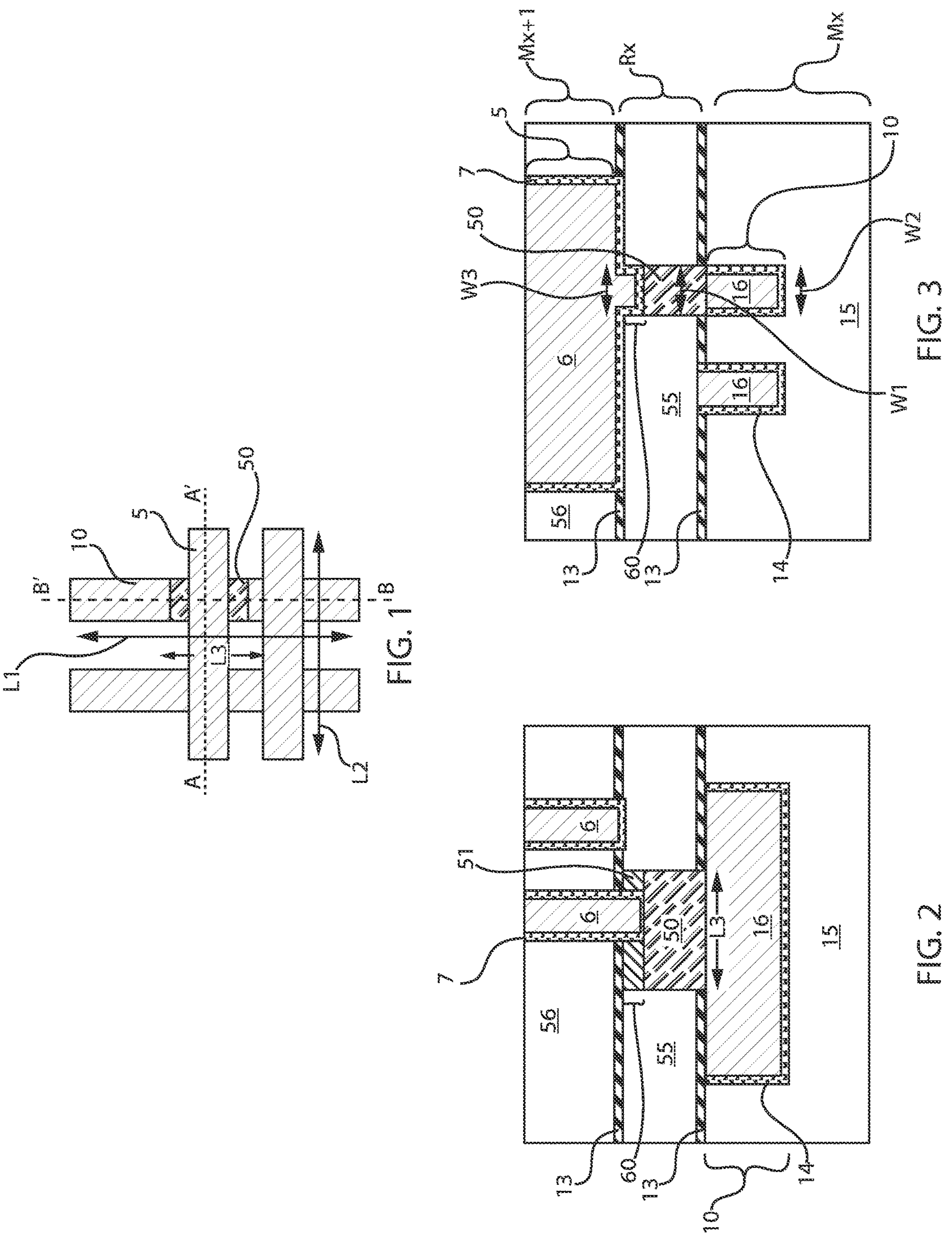
FIG. 1 is a top down view of an interconnect including a via including an elongated and recessed interface via portion, in accordance with one embodiment of the present disclosure.
FIG. 2 is a side cross-sectional view of the via depicted in FIG. 1 along section line A-A.
FIG. 3 is a side cross-sectional view of the via depicted in FIG. 1 along section line B-B.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present description. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In a single damascene process, the trenches and vias are formed one step at a time. In contrast to single damascene, for dual damascene processing the trenches and vias are formed simultaneously in dual damascene.

In the dual damascene process, a structure undergoes a diffusion barrier etch step. Then, a via dielectric is deposited. An etch step then forms a gap, where the lines and vias are formed. Then, a thin layer of barrier of tantalum (Ta) and tantalum nitride (TaN) materials are deposited using physical vapor deposition (PVD). Ta is used to form the liner and TaN is for the barrier in a structure. The barrier layer is coated over by a copper seed barrier via PVD. And finally, the structure is electroplated with copper and ground flat using chemical mechanical polishing (CMP). However, with increasing scaling, resistance capacitance (RC) delay has been observed in dual damascene processing.

It has been determined that single damascene lines offer the opportunity to relax the barrier/liner thickness requirements and increase the line height, which can reduce the net resistance capacitance (RC) delay. Broadly, in a single damascene process, the via layer and the trench layer are deposited and structured one after each other, so that there are more process steps include ILD deposition, followed by via structuring and copper deposition to fill the via, which is then followed by planarization. Thereafter, another ILD deposition is performed followed by trench structuring and copper deposition to fill the trenches for the metal lines. Finally, the structure is planarized.

However, in single damascene process slows, alignment issues, e.g., overlay misalignment, can result in the via and metal lines not making full contact, which can result in an increased resistance at the interface of the structures. A via misaligned from the contact through which electrical signal is transmitted can increase the resistance of the structure significantly.

In some embodiments, the methods and structures that are described herein provide a self-aligned single damascene interconnect with a recessed elongated via metal. By "elongated" it is meant that the portion of the via that is in direct contact with the upper surface of the metal line has a greater dimension in a direction parallel to the length of the metal line than the dimension of the portion of the via that is in direction contact with the metal line in a direction perpendicular to the length of the metal line. This provides a greater interface area between the metal line and the portion of the via in direct contact with the metal line. By "recessed" it is meant that the elongated portion of the via does not extend entirely through the via level dielectric layer (Vx) that is directly above the metal level dielectric layer (Mx) having the metal line that the via, e.g., elongated via is in direct contact with. The upper surface of the via level dielectric layer ($V_x$) and the upper surface of the elongated portion of the via are vertically offset from one another. In some embodiments, the recessed and elongated via structures can enable a single damascene process flow without resistance penalties. The vias can be aligned, e.g., self-aligned, to upper-level metal lines. Further, in some embodiments, the methods and structures of the present disclosure provide substantially no breakdown voltage (Vbd) degradation when compared to source/drain processing. The method and structures for self-aligned single damascene formed interconnects with recessed elongated vias are now described in more detail with reference to FIGS. 1-9.

FIGS. 1-3 illustrate one embodiment of an interconnect including an elongated and recessed interface via portion 50. FIG. 1 is a top-down view of two upper metal lines 5 having a length L2 extending parallel to section line A-A', and two lower metal lines 10 extending having a length L1 extending parallel to section line B-B'. In the example depicted in FIG. 1, the two upper metal lines 5 have a length L2 that is perpendicular to the length L1 of the two lower metal lines. It is noted that FIG. 1 is only an illustration of one example, and the present invention is not limited to only this example for the number of lines on a level. The metal lines 5, 10 are present in metal line levels ($M_x$, $M_{Mx+1}$). Between the metal line levels ($M_x$, $M_{Mx+1}$) is a via level (Vx).

In one embodiment, the lower metal lines 10 are present in a first metal line level (Mx), which includes the lower metal lines 10 that are present within a first metal line level interlevel dielectric layer 15, as depicted in FIGS. 2 and 3. The first metal lines 10 may include a metal fill 16 present within trenches in the first metal line level interlevel dielectric layer 15. In some embodiments, the metal fill 16 is separated from the first metal line level interlevel dielectric layer 15 by a liner material layer 14. The liner material layer 14 may have a conformal thickness, and may be a metal nitride, such as tantalum nitride (TaN), which can serve as a diffusion barrier. In some embodiments, the liner material layer 14 can be a seed layer, which can be provided by a layer of cobalt, ruthenium and/or copper. The metal fill 16 may be copper. However, other compositions have also been contemplated for the metal fill 16 and the liner material layer 14. The first metal line level interlevel dielectric layer 15 may be composed of a low-k dielectric layer, such as carbon doped silicon, e.g., SiCOH.

Referring to FIGS. 2 and 3, in some embodiments, a dielectric cap 13 is present atop the first metal line level interlevel dielectric layer 15. The dielectric cap 13 may be a nitride, such as silicon nitride.

FIG. 2 further illustrates one embodiment of a via level ($V_x$) for a self-aligned single damascene interconnected with recessed elongated via metal. The via level ($V_x$) may include a first dielectric 51 (also referred to as intralevel dielectric 51) positioned on a first metal contact 50 (also referred to as an interface metal portion 50 of the via). A second dielectric 55 (also referred to as interlevel dielectric layer 55) is laterally surrounding the first dielectric 51 and the first metal contact 50. A second metal contact 60 (also referred to as a metal cap layer 60) is present extending through the first dielectric 51 into contact with the first metal contact 50. The first and second metal contacts 50, 60 provide the electrically conductive pathway through the via level ($V_x$) that electrically connect the first metal line 10 that is present in the first metal line level ($M_x$) to the second metal liner 5 that is present in the second metal line level ($M_{x+1}$).

In one embodiment, the first metal contact 50 (interface metal portion 50 of the via) has a first length L3 dimension that is greater than a first width W1 dimension for the first metal contact 50. The length L3 of the first metal contact 50 (interface metal portion 50 of the via) is a dimension running along a substantially same plane as the length dimension L1 of the first metal line 10 in the underlying first metal line level ($M_{x+1}$). This provides that the first metal contact 50 portion of the via that is in direct contact with the underlying metal line 10 has an increased surface area for the landing area of the second metal contact, when compared to prior via structures in which the width W1 and length L3 dimensions of the via are substantially equal along their entire height. The width W1 of the first metal contact 50 (interface metal portion 50) of the via is substantially the same as the width W2 of the underlying metal line 10. The first metal contact 50 may be aligned with the underlying metal line 10 so that no portion of the first metal contact 50 extends onto the first metal line level interlevel dielectric layer 15, as depicted in FIG. 3.

Referring back to FIG. 2, the second metal contact 60 (cap metal portion of the via stack) has a length dimension L4 that is less than the length dimension L2 of the first metal contact 50 (interface metal portion 50 of the via stack). The first metal contact 50 (interface metal portion 50 of the via stack) having a length L3 greater than its width W1, and having a length L3 greater than the length L4 of the overlying second metal contact 60 (cap metal portion of the via stack) may be referred to as an "elongated" portion of the via. Referring to FIG. 3, the second metal contact 60 (cap metal portion of the via stack) has a width dimension W3 that is substantially equal to the width W1 dimension of the first metal contact 50 (interface metal portion 50 of the via stack).

In some embodiments, the first metal contact 50 may be referred to as "recessed". This means that the surface of the first metal contact 50 that the first dielectric 51 in the via level $V_x$ (also referred to as via intralevel dielectric layer 51) is present on may be vertically offset, i.e., recessed, relative to the surface of the second dielectric 51 within the via level $V_x$ (also referred to as via interlevel dielectric layer 55), which is underlying the upper metal line level ($M_x$). The upper surface of the first dielectric 51 (also referred to as via intralevel dielectric layer 51) may be coplanar with the upper surface of the second dielectric 55 (also referred to as via interlevel dielectric layer 55).

The via level $V_x$ is positioned proximate to the upper metal line level $M_{x+1}$. In some embodiments, a dielectric cap 14 may be present between the via level $V_x$ and the upper meta line level $M_{x+1}$. The dielectric cap 14 may be a metal nitride, such as silicon nitride.

In one embodiment, upper metal lines 5 are present in a second metal line level (Mx+1), which includes the upper metal lines 5 that are present within a second metal line level interlevel dielectric layer 56, as depicted in FIGS. 2 and 3. The upper metal lines 5 may include a metal fill 6 present within trenches in the second metal line level interlevel dielectric layer 56. In some embodiments, the metal fill 6 is separated from the second metal line level interlevel dielectric layer 56 by a liner material layer 7. The liner material layer 7 may have a conformal thickness, and may be a metal nitride, such as tantalum nitride (TaN), which can serve as a diffusion barrier. In some embodiments, the liner material layer 7 can be a seed layer, which can be provided by a layer of cobalt, ruthenium and/or copper. The metal fill 6 may be copper. However, other compositions have also been contemplated for the metal fill 6 and the liner material layer 7. The second metal line level interlevel dielectric layer 56 may be composed of a low-k dielectric layer, such as carbon doped silicon, e.g., SiCOH.

A line trench may be present in the second line level dielectric 56, in which the line trench is filled with the liner material layer 7 and the metal fill 6. The line trench is present overlying the via stack including an opening in the first dielectric 51 (also referred to as the via intralevel dielectric layer 51) and the first metal contact 50 (also referred to as interface metal portion 50 of the via stack). In some embodiments, the second metal contact 60 (also referred to as cap metal portion 60 of the via stack) is provided by a portion of the liner material layer 7 and the metal fill 6 that extends from the second metal line level ($M_x$+1) into the via level ($V_x$) to provide the second metal contact 60 (also referred to as cap metal portion 60 of the via stack).

Referring to FIGS. 2 and 3, in some embodiments, a dielectric cap 13 is present between the via level $V_x$ and the second metal line level interlevel dielectric layer 56. The dielectric cap 13 may be a nitride, such as silicon nitride.

The structure depicted in FIGS. 2 and 3 provides that the lower metal line 10 in the first metal line level ($M_x$) is fully aligned to the via stack of the first metal contact 50 (interface metal portion 50 of the via) and the second metal contact 60 (metal cap portion 60). The structures depicted in FIGS. 1-3 can enable a single damascene process flow without a resistance penalty. Further, the recessed nature of the first metal contact 50 ensures that shorts do not occur between the via stack 50, 60 and neighboring metal lines 80 that not intended to be in direct electrical communication, as depicted in FIG. 2.

One method that may be employed in producing the structure depicted in FIGS. 1-3 is not described with reference to FIGS. 4-9.

Figure 4:
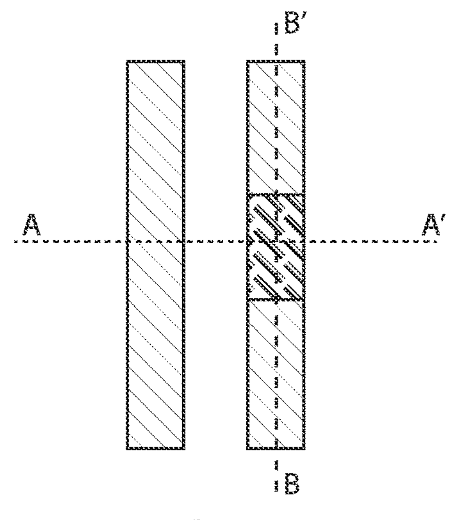
FIG. 4 is a top down view of an initial structure employed in forming a via including an elongated and recessed interface via portion, the initial structure including a first metal line level having first metal lines present therein and a via level including an elongated interface metal portion of the metal via, in accordance with one embodiment of the present disclosure.
Figure 5:
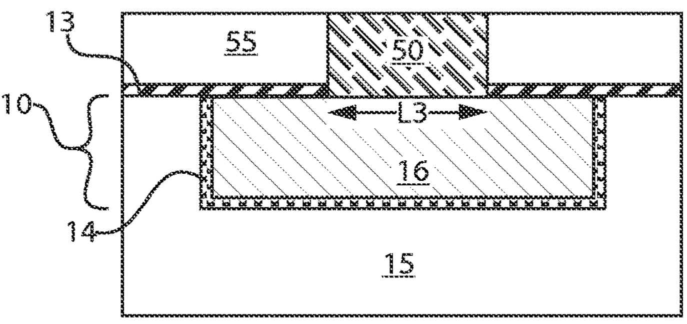
FIG. 5 is a side cross-sectional view of the initial structure depicted in FIG. 4 along section line A-A.
Figure 6:
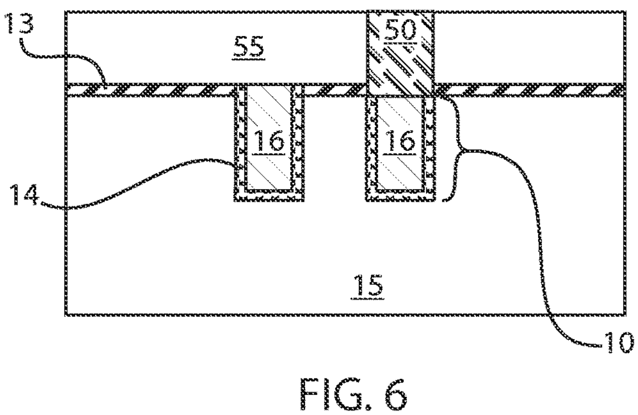
FIG. 6 is a side cross-sectional view of the initial structure depicted in FIG. 4 along section line B-B.

FIGS. 4-6 depicts an initial structure employed in forming a via including an elongated and recessed interface via portion. The elongated and recessed interface via portion of the via is provided by the first metal contact 50 (also referred to as interface metal portion 50 of the via stack) depicted in FIG. 1. The initial structure including a first metal line level (Mx) having first metal lines 10 present therein and a via level $V_x$ including an elongated interface metal portion 50 (also referred to as first metal contact 50) of the metal via. Each of the first metal line level ($M_x$) and the via level ($V_x$) that are depicted in FIG. 4 are formed using a single damascene method.

Broadly, in a single damascene process, the via layer ($V_x$) and the trench layer, e.g., first metal line level ($M_x$), are deposited and structured one after each other, so that the process steps can include the metal line level interlevel dielectric (ILD) layer 15 deposition, followed by metal line trench structuring and conductive material deposition to fill the trench, which is then followed by planarization.

The first metal line level interlevel dielectric layer 15 may be any suitable dielectric material such as silicon oxide, silicon nitride, hydrogenated silicon carbon oxide, low-k dielectrics, ultra-low-k dielectrics, flowable oxides, porous dielectrics, or organic dielectrics including porous organic dielectrics. Low-k dielectric materials have a nominal dielectric constant less than the dielectric constant of $SiO_2$, which is approximately 4 (e.g., the dielectric constant for thermally grown silicon dioxide can range from 3.9 to 4.0). In one embodiment, low-k dielectric materials may have a dielectric constant of less than 3.7. Suitable low-k dielectric materials include, for example, fluorinated silicon glass (FSG), carbon doped oxide, a polymer, a SiCOH-containing low-k material, a non-porous low-k material, a porous low-k material, a spin-on dielectric (SOD) low-k material, or any other suitable low-k dielectric material. Ultra low-k (ULK) dielectric materials have a nominal dielectric constant less than 2.5. Suitable ultra low-k dielectric materials include, for example, SiOCH, porous pSiCOH, pSiCNO, carbon rich silicon carbon nitride (C-Rich SiCN), porous silicon carbon nitride (pSiCN), boron and phosporous doped SiCOH/pSiCOH and the like.

In one example, the dielectric composition for the first metal line level interlevel dielectric layer 15 may be carbon doped silicon glass (SiCOH) having a dielectric constant ranging from 2.2 to 3.0. The dielectric material may be deposited using a deposition process, such as chemical vapor deposition (CVD), e.g., plasma enhanced chemical vapor deposition (PECVD).

The first metal line level interlevel dielectric layer 15 may be patterned using photolithography, and an etch process, such as reactive ion etching (RIE), may be performed to transfer the trench pattern into the first metal line level interlevel dielectric layer 15. Following formation of the trench for the first metal line, an electrically conductive material is deposited into the trench using a deposition process, such a chemical vapor deposition, plating, electroplating, electroless plating and physical vapor deposition, e.g., sputtering. In some embodiments, a liner layer 14, e.g., an adhesion layer and/or diffusion barrier layer, is formed first followed by a metal fill 16. In some embodiments, the liner layer 14 is a diffusion barrier layer composed of a metal nitride, such as tantalum nitride (TaN). In some embodiments, the liner layer 14 is an adhesion layer, such as a seed layer of copper (Cu), cobalt (Co) or ruthenium (Ru). Following the liner layer 14, a first metal fill 16 for the first metal line 10 is deposited filling the trench.

The first metal fill 16 may be deposited using plating, electroplating, electroless plating, or a deposition process, such as physical vapor deposition, e.g., sputtering. In one embodiment, the metal for the first metal fill 16 includes, for example, Al, W, Cu, Co, Ru, Mo, etc. In one example, the first metal fill 16 is copper (Cu).

The deposited metal fill 16 is then planarized to ensure that the upper surface of the first metal fill is coplanar with the upper surface of the first metal line level interlevel dielectric layer 15. The planarization process may be chemical mechanical planarization (CMP).

In some embodiments, a dielectric cap 13 is blanket deposited atop an upper surface of the first line level interlevel dielectric (ILD) layer 15 and the metal fill 16 of the first metal line 15. The dielectric cap 13 may be a metal nitride, such as silicon nitride ($Si_3N_4$) or silicon carbon nitride (SiCN).

In some embodiments, continuing with a single damascene methodology, the via interlevel dielectric (ILD) layer 55 (also referred to as a second dielectric 55) and the interface metal portion 50 of the via stack (also referred to as first metal contact 50) within the via level (Vx) may then be formed. The via interlevel dielectric (ILD) layer 55 may have a composition that is similar to the first metal line level interlevel dielectric (ILD) layer 15. For example, the via interlevel dielectric (ILD) layer 55 may be composed of a low-k dielectric, such as SiCOH.

The via stack opening may then be formed through the via interlevel dielectric (ILD) layer 55. The via stack opening is formed using photolithography and etch processes. A via stack pattern is produced using photolithography. The pattern in then transferred into the initial structure. For example, the via opening may be etched through the via level interlevel dielectric, and through the dielectric cap 13. The dielectric cap 13 may be etched using an etch that is selective to the metal fill 16 of the first metal line 10.

The via stack opening may then be filled with an electrically conductive material to provide the interface metal portion 50 (also referred to as first metal contact 50). The electrically conductive material for the interface metal portion 50 may be deposited using plating, electroplating, electroless plating, or a deposition process, such as physical vapor deposition, e.g., sputtering. In one embodiment, the metal for the interface metal portion 50 of the via stack includes, for example, Al, W, Cu, Co, Ru, Mo, etc. In one example, the interface metal portion 50 (also referred to as first metal contact 50) is copper (Cu).

The deposited fill for the interface metal portion 50 (also referred to as first metal contact 50) is then planarized to ensure that the upper surface of the interface metal portion 50 is coplanar with the upper surface of the via level interlevel dielectric layer 55, as depicted in FIGS. 5 and 6. The planarization process may be chemical mechanical planarization (CMP).

The dimensions for the interface metal portion 50 are selected so that the length L3 of the interface metal portion 50 for the via stack is greater than the width W1 of the interface metal portion 50. The length L3 of the interface metal portion 50 is along a direction that is substantially parallel to the length dimension L1 of the metal line 10 that is present within the first metal line level ($M_x$). The greater length dimension L1, versus the width W1 of the interface metal portion 50, illustrates that the interface metal portion 50 (also referred to as first metal contact 50) for the via stack has an "elongated" width.

Figure 7:
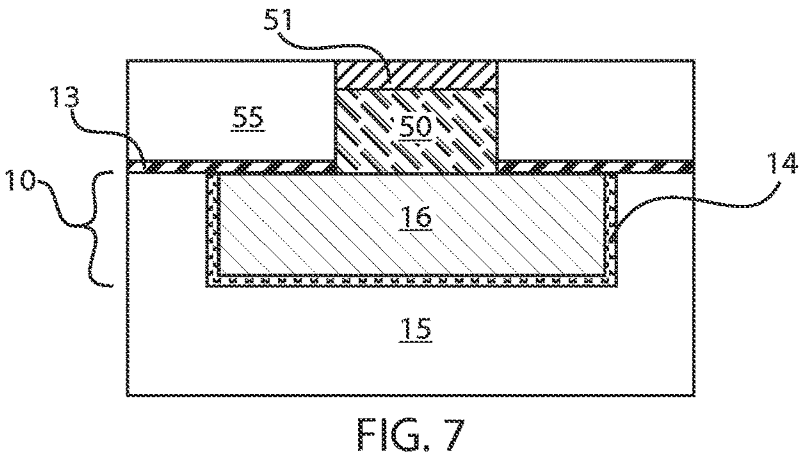
FIG. 7 is a side cross-sectional view of recessing an upper portion of the interface via portion that is depicted in FIG. 5, forming an intralevel dielectric layer atop the recessed surface of the interface via portion, and planarizing the interlevel dielectric layer, in accordance with one embodiment of the present disclosure.

FIG. 7 illustrates one embodiment of recessing the upper surface of the interface metal portion 50 (also referred to as first metal contact 50) of the via stack. The cross-section depicted in FIG. 7 is along the length L1 of the metal line 10 in the first metal line level ($M_x$). The cross section along the length L1 of the metal line 10 depicted in FIG. 7 is similar to a cross section along section line B-B of FIG. 1.

Recessing the upper surface of the interface metal portion 50 (first metal contact 50) for the via stack may include a wet or dry etch process. The etch process for recessing the upper surface of the interface metal portion 50 may be selective to the via level interlevel dielectric 55 (also referred to as second dielectric 55). In one embodiment, in which the interface metal portion 50 is composed of copper (Cu), the etch process for recessing the upper surface of the interface metal portion 50 is a wet etch. In another embodiment, in which the interface metal portion 50 is composed of tungsten (W), the etch process for recessing the upper surface of the interface metal portion 50 may be a dry etch, such as reactive ion etching (RIE). In some embodiments, the upper surface of the interface metal portion 50 may be recessed 5 nm to 10 nm, as measured from the upper surface of the via level interlevel dielectric (ILD) layer 55 (also referred to as second dielectric 55). The selective etch process applied to the interface metal portion 50 (first metal contact 50) of the via stack relative to the via level interlevel dielectric (ILD) layer provides that the upper surfaces of the interface metal portion 50 and the via level interlevel dielectric (ILD) layer are vertically offset from one another, e.g., the upper surface of the interface metal portion 50 for the via stack is recessed within the vial level (Vx).

FIG. 7 further illustrates forming the via intralevel layer 51 (also referred to as first dielectric 51) on the recessed surface of the interface metal portion 50 (first metal contact 50) of the via stack. The term "intralevel" when used to describe the via interlevel layer 51 means that the thickness of the dielectric layer places the dielectric layer within the via level (Vx). An intralevel dielectric layer is distinguished from an interlevel dielectric layer, as the interlevel dielectric has a thickness to extend between the entirety of the metal line level ($M_x$, $M_{x+1}$) or the via level ($V_x$), whereas the intralevel dielectric has a thickness that is less than the height of the line/via level to be within the level.

The via intralevel dielectric layer 51 (first dielectric 51) may have a composition that is different from the via interlevel dielectric layer 55 (second dielectric 55). For example, the via level interlevel dielectric layer 55 (second dielectric 55) is generally a low-k dielectric material, such as SiCOH, while the via intralevel dielectric layer (first dielectric 51) may be composed of a metal nitride, such as silicon nitride or silicon carbon nitride. In other embodiments, the via intralevel dielectric layer 51 (first dielectric 51) may be composed of aluminum oxide or aluminum oxynitride.

The gap formed by recessing the interface metal portion 50 (first metal contact 50) of the via stack is filled by the intralevel dielectric layer 51 (first dielectric 51), which can be deposited using chemical vapor deposition (CVD), such as plasma enhanced chemical vapor deposition (PECVD). In some embodiments, following the deposition of the material for the intralevel dielectric layer 51 (first dielectric 51), a planarization process is performed, such as chemical mechanical planarization (CMP), to provide that the upper surface of the via intralevel dielectric layer 51 (first dielectric 51) is coplanar with the upper surface of the via interlevel dielectric layer 55 (second dielectric 55). Following planarization, the entirety of the via interlevel dielectric layer 55 is present within the gap provided by recessing the interface metal portion 50 (first metal contact 50) of the via stack. This provides that the sidewalls of the via intralevel dielectric layer 51 are aligned to the sidewalls of the interface metal portion 50 of the via stack.

Further, because the via intralevel dielectric layer 51 (first dielectric 51) fills the space between the recessed surface of the interface metal portion 50 (first meal contact 50) and the uppermost boundary for the via level ($V_x$), and the via interlevel dielectric layer 55 (second dielectric 51) has a thickness that extends across an entire height of the via level ($V_x$); the interlevel dielectric layer 55 (second dielectric 55) may be referred to as laterally surrounding the intralevel dielectric layer 51 (first dielectric 51) and the interface metal portion 50 (first metal contact 50) of the via stack.

Figure 8:
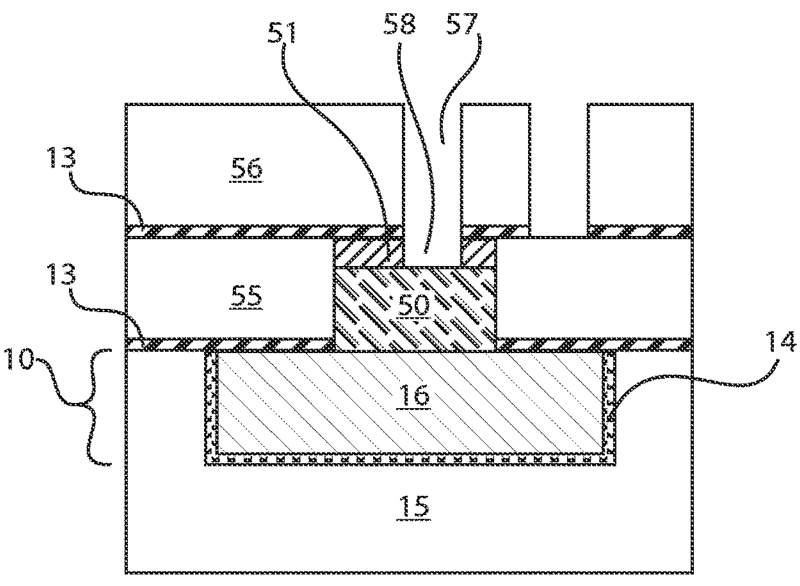
FIG. 8 is a side cross-sectional view of forming a second metal line level atop the via level depicted in FIG. 7, forming a trench in the interlevel dielectric layer of the second metal line level, and forming an opening through the trench base and the intralevel layer dielectric to expose a portion of the interface via portion.
Figure 9:
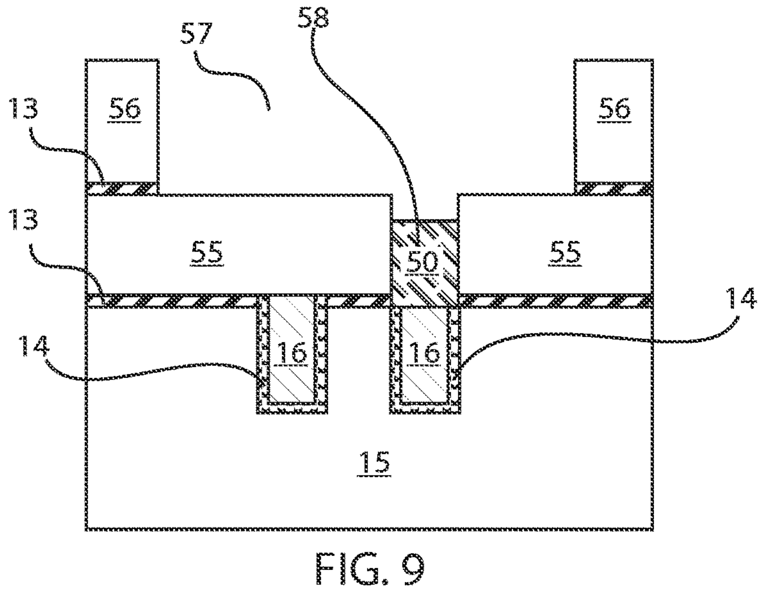
FIG. 9 is a side cross-sectional view along the width of the first metal line of the structure depicted in FIG. 8.

FIGS. 8 and 9 depict one embodiment of forming a second metal line level ($M_x$+1) atop the via level ($V_x$). FIG. 8 is a side cross-sectional view of forming a second metal line level ($M_x$+1) atop the via level ($V_x$) depicted in FIG. 7, forming a trench 57 in the second metal line level interlevel dielectric layer 56 of the second metal line level. The cross-section depicted in FIG. 8 is along the length L1 of the metal line 10 in the first metal line level ($M_x$). The cross section along the length L1 of the metal line 10 depicted in FIG. 8 is similar to a cross section along section line B-B of FIG. 1. FIG. 8 also depicts forming an opening 59 through the trench base and the intralevel layer dielectric 51 (second dielectric 51) to expose a portion of the interface via portion 50 (first metal contact 50). FIG. 9 is a side cross-sectional view along the width W2 of the first metal line 10 of the structure depicted in FIG. 8. The cross-section depicted in FIG. 9 is along the width W2 of the metal line 10 in the first metal line level ($M_x$). The cross section along the width W2 of the metal line 10 depicted in FIG. 9 is similar to a cross section along section line A-A of FIG. 1.

In some embodiments, a dielectric cap layer 13 is formed on the upper surface of the via interlevel dielectric (ILD) layer 55 (second dielectric 55). The dielectric cap layer 13 may be composed of a metal nitride. For example, the metal nitride that is employed for the dielectric cap layer 13 may be silicon nitride. The metal nitride for the dielectric cap layer 13 may be blanket deposited by a chemical vapor deposition (CVD) process, such as plasma enhanced chemical vapor deposition (PECVD).

Referring to FIGS. 8 and 9 forming the second metal line level ($M_x$) may be performed using a single damascene process.

The second metal line level interlevel dielectric layer 56 may be any suitable dielectric material such as silicon oxide, silicon nitride, hydrogenated silicon carbon oxide, low-k dielectrics, ultra-low-k dielectrics, flowable oxides, porous dielectrics, or organic dielectrics including porous organic dielectrics. Low-k dielectric materials have a nominal dielectric constant less than the dielectric constant of $SiO_2$, which is approximately 4 (e.g., the dielectric constant for thermally grown silicon dioxide can range from 3.9 to 4.0). In one embodiment, low-k dielectric materials may have a dielectric constant of less than 3.7. Suitable low-k dielectric materials include, for example, fluorinated silicon glass (FSG), carbon doped oxide, a polymer, a SiCOH-containing low-k material, a non-porous low-k material, a porous low-k material, a spin-on dielectric (SOD) low-k material, or any other suitable low-k dielectric material. Ultra low-k (ULK) dielectric materials have a nominal dielectric constant less than 2.5. Suitable ultra low-k dielectric materials include, for example, SiOCH, porous pSiCOH, pSiCNO, carbon rich silicon carbon nitride (C-Rich SiCN), porous silicon carbon nitride (pSiCN), boron and phosporous doped SiCOH/pSiCOH and the like.

In one example, the dielectric composition for the second metal line level interlevel dielectric layer 56 may be carbon doped silicon glass (SiCOH) having a dielectric constant ranging from 2.2 to 3.0. The dielectric material may be deposited using a deposition process, such as chemical vapor deposition (CVD), e.g., plasma enhanced chemical vapor deposition (PECVD).

The second metal line level interlevel dielectric layer 56 may be patterned using photolithography, and an etch process, such as reactive ion etching (RIE), may be performed to transfer the trench pattern into the second metal line level interlevel dielectric layer 56. The trench pattern may include a trench 57 for producing a metal line 5 that is in electrical communication with the via stack including the interface via portion 50 (first metal contact 50). The trench pattern may also provide another trench in the second metal line level interlevel dielectric (ILD) layer 56 that is not in electrical communication with the via stack.

The etch process for forming the trench 57 includes a first etch process for removing the second metal line level interlevel dielectric (ILD) layer 56 selective to the dielectric cap layer 13. In a following process step, the exposed portion of the dielectric cap layer 13 may be removed selectively to the underlying via intralevel dielectric layer 51. Removing a portion of the via intralevel dielectric layer 51 exposes a portion of the interface via portion 50 (first metal contact 50). The etch processes for removing the portions of the dielectric cap layer 13 within the trench 57, and removing the portion of the intralevel dielectric layer 51 to expose the surface of the interface via portion 50 provides an opening 58 that is subsequently filled to provide a cap metal portion 60 (second metal contact 60) for the via stack.

Referring to FIGS. 1-3, following formation of the trench 57 and the opening 58 for the second metal line 5 that will be in electrical communication with the via stack including the interface metal portion 50 (first metal contact 50), an electrically conductive material is deposited into the trench 57 and opening 58 using a deposition process, such a chemical vapor deposition, plating, electroplating, electroless plating and physical vapor deposition, e.g., sputtering. In some embodiments, a liner layer 7, e.g., an adhesion layer and/or diffusion barrier layer, is formed first followed by a metal fill 6. In some embodiments, the liner layer 7 is a diffusion barrier layer composed of a metal nitride, such as tantalum nitride (TaN). In some embodiments, the liner layer 7 is an adhesion layer, such as a seed layer of copper (Cu), cobalt (Co) or ruthenium (Ru). Following the liner layer 7, a second metal fill 6 for the second (upper) metal line 5 is deposited filling the trench 57 and the opening 58. A portion of the liner layer 7 is in contact in the interface via portion 50 of the via stack.

The second metal fill 6 may be deposited using plating, electroplating, electroless plating, or a deposition process, such as physical vapor deposition, e.g., sputtering. In one embodiment, the metal for the second metal fill 6 includes, for example, Al, W, Cu, Co, Ru, Mo, etc. In one example, the second metal fill 6 is copper (Cu).

The second metal fill 6 can then planarized to ensure that the upper surface of the first metal fill is coplanar with the upper surface of the second metal line level interlevel dielectric layer 56. The planarization process may be chemical mechanical planarization (CMP).

FIGS. 8 and 9 depict one depositing an electrically conductive fill in the trench 57, 58 of the second metal line interlevel dielectric layer 56 to provide a second metal line 5, where a portion of the electrically conductive fill (e.g., line 7 and fill 6) is positioned on the recessed surface of the interface metal portion 50 (first metal contact 50) to provide a cap metal portion 60 (also referred to as second metal contact 60) of the via stack that is in electrical communication with the second metal line 5 and is aligned with the interface metal portion 50 (first metal contact 50) of the via stack.

Referring to FIGS. 1-3, in one embodiment, a semiconductor structure is provided that includes a first metal line level ($M_x$) having a first metal line 10, and a second metal line level ($M_x$+1) having a second metal line 5. A via line level ($V_x$) present between the first and second metal line levels (Mx, Mx+1). The via line level ($V_x$) includes a via interlevel dielectric 55 surrounding a via stack including an interface metal portion 50 that is in contact with the first metal line 10, a via intralevel dielectric 51 on the interface metal portion 50, and a cap metal portion 60 in contact with the second metal line 5 and extending through the via intralevel dielectric 51 into contact with the interface metal portion 50. In some embodiments, a length L3 of the interface metal portion 50 of the via is greater than a width W1 of the interface metal portion 50 of the via stack. In some embodiments, a first cap dielectric layer 13 is present between the first metal line level ($M_x$) and the via line level ($V_x$). In some embodiments, a second cap dielectric layer 13 is present between the second metal line level and the via line level.

In some embodiments, the length L3 of the interface metal portion 50 of the via is substantially parallel to a metal line length L1 for the first metal line 5. The cap metal portion 60 has a length dimension that is less than the length dimension L3 of the interface metal portion 50 of the via stack. Further, the cap metal portion 60 has a width W3 dimension that is substantially equal to the width W1 dimension of the interface metal portion 50 of the via stack. In some embodiments, the width dimension W1 of the interface metal portion 50 of the via stack is substantially equal to a metal line width W2 for the first metal line 10. In some embodiments, the interface metal portion has a width substantially equal to a metal line width for the first metal line.

In some embodiments, the second metal line level ($M_x$+1) includes a second line level dielectric 56 having a line trench filled with a seed layer 7 and a metal fill 6, wherein a portion of the seed layer 7 and metal fill 6 extends from the second metal line level ($M_x$+1) into the via level ($V_x$) to provide the cap metal portion 60.

Having described preferred embodiments of a structure and method for forming a barrier liner free interface for metal via, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:

a first metal line level having a first metal line;

a second metal line level having a second metal line;

a first metal contact disposed in a via level and extending into contact with the first metal line, the first metal contact having a recessed upper surface;

a first dielectric on the recessed upper surface of the first metal contact;

a second dielectric laterally surrounding the first dielectric and the first metal contact, wherein an upper surface of the first dielectric is coplanar with an upper surface of the second dielectric; and a second metal contact in contact with the second metal line and extending through the first dielectric into contact with the first metal contact.

2. The semiconductor structure of claim 1, wherein the first metal contact has a first length dimension that is greater than a first width dimension of the first metal contact.

3. The semiconductor structure of claim 2, wherein the second metal contact has a second length dimension that is less than the first length dimension of the first metal contact, and the second metal contact has a second width dimension that is substantially equal to the first width dimension of the first metal contact.

4. The semiconductor structure of claim 1, wherein the second metal contact is disposed in the via level.

5. The semiconductor structure of claim 2, wherein the via level underlies the second metal line level, and wherein a first interface between the first dielectric and the first metal contact is vertically offset from a second interface of the second dielectric and the second metal line level.

6. The semiconductor structure of claim 2, wherein the second metal line level overlies the via level, wherein the via level includes the second metal contact, wherein the second metal line level includes a second line level dielectric having a line trench filled with a seed layer and a metal fill, and wherein a portion of the seed layer and a portion of the metal fill extend from the second metal line level into the via level to provide the second metal contact.

7. The semiconductor structure of claim 1, wherein a length dimension of the first metal contact is substantially parallel to a metal line length of the first metal line.

8. The semiconductor structure of claim 1, wherein a width dimension of the first metal contact is substantially equal to a metal line width of the first metal line.

9. The semiconductor structure of claim 1, further comprising a first metal line level interlevel dielectric in the first metal line level, wherein no portion of the first metal contact extends onto the first metal line level interlevel dielectric.

10. The semiconductor structure of claim 1, wherein sidewalls of the first dielectric are aligned with sidewalls of the first metal contact.

11. A semiconductor structure comprising:

a first metal line level having a first metal line;

a second metal line level having a second metal line; and a via line level present between the first and second metal line levels, wherein the via line level includes a via interlevel dielectric surrounding a via stack, the via stack including an interface metal portion disposed in the via interlevel dielectric and extending into contact with the first metal line, the interface metal portion having a recessed upper surface, a via intralevel dielectric on the recessed upper surface of the interface metal portion, and a cap metal portion in contact with the second metal line and extending through the via intralevel dielectric into contact with the interface metal portion, wherein a length of the interface metal portion of the via stack is greater than a width of the interface metal portion of the via stack, and wherein an upper surface of the via intralevel dielectric is coplanar with an upper surface of the via interlevel dielectric.

12. The semiconductor structure of claim 11, wherein a first cap dielectric layer is present between the first metal line level and the via line level.

13. The semiconductor structure of claim 11, wherein a second cap dielectric layer is present between the second metal line level and the via line level.

14. The semiconductor structure of claim 11, wherein the length of the interface metal portion of the via stack is substantially parallel to a metal line length of the first metal line.

15. The semiconductor structure of claim 11, wherein the cap metal portion has a length dimension that is less than the length of the interface metal portion of the via stack, and the cap metal portion has a width dimension that is substantially equal to the width of the interface metal portion of the via stack.

16. The semiconductor structure of claim 15, wherein the width of the interface metal portion of the via stack is substantially equal to a metal line width of the first metal line.

17. The semiconductor structure of claim 15, wherein the second metal line level includes a second line level dielectric having a line trench filled with a seed layer and a metal fill, wherein a portion of the seed layer and a portion of the metal fill extends from the second metal line level into the via line level to provide the cap metal portion.

18. The semiconductor structure of claim 11, wherein the recessed upper surface of the interface metal portion is vertically offset from the upper surface of the via interlevel dielectric by 5 nanometers to 10 nanometers.

19. The semiconductor structure of claim 11, further comprising a first metal line level interlevel dielectric in the first metal line level, wherein no portion of the interface metal portion extends onto the first metal line level interlevel dielectric.

20. The semiconductor structure of claim 11, wherein the cap metal portion has a bottom surface directly contacting the recessed upper surface of the interface metal portion.

* * * * *